US010475586B2

(12) United States Patent
Shibahara et al.

(10) Patent No.: US 10,475,586 B2
(45) Date of Patent: Nov. 12, 2019

(54) OXYNITRIDE THIN FILM AND CAPACITANCE ELEMENT

(71) Applicant: TDK CORPORATION, Tokyo (JP)

(72) Inventors: Takeshi Shibahara, Tokyo (JP); Yuki Nagamine, Tokyo (JP); Yoshitomo Tanaka, Tokyo (JP); Kumiko Yamazaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/938,616

(22) Filed: Mar. 28, 2018

(65) Prior Publication Data

US 2018/0301284 A1 Oct. 18, 2018

(30) Foreign Application Priority Data

Mar. 31, 2017 (JP) ................................ 2017-071119
Jan. 30, 2018 (JP) ................................ 2018-013707

(51) Int. Cl.

| | |
|---|---|
| ***H01G 4/33*** | (2006.01) |
| ***H01L 49/02*** | (2006.01) |
| ***H01G 4/08*** | (2006.01) |
| ***C01B 21/082*** | (2006.01) |
| *H01G 4/30* | (2006.01) |

(52) U.S. Cl.

CPC ........... *H01G 4/33* (2013.01); *C01B 21/0821* (2013.01); *H01G 4/085* (2013.01); *H01L 28/55* (2013.01); *C01P 2002/60* (2013.01); *C01P 2002/78* (2013.01); *C01P 2006/40* (2013.01); *H01G 4/306* (2013.01)

(58) Field of Classification Search

CPC . C04B 35/58007; C04B 35/495; C04B 35/46; C04B 35/62655; C04B 35/64;

(Continued)

(56) References Cited

U.S. PATENT DOCUMENTS 4,734,390 A 3/1988 Marchand et al.
6,878,666 B2 * 4/2005 Domen .................... B01J 23/02 501/96.1

(Continued)

FOREIGN PATENT DOCUMENTS

JP S61-122108 A 6/1986
JP 2013001625 A 1/2013

OTHER PUBLICATIONS

Daichi Oka et al; "Possible ferroelectricity in perovskite oxynitride SrTaO2N epitaxial thin films"; Scientific Reports; May 16, 2014; pp. 1-6.

(Continued)

*Primary Examiner* — Noah S Wiese
(74) *Attorney, Agent, or Firm* — Oliff PLC

(57) ABSTRACT

The object of the present invention is to provide a dielectric thin film and a capacitance element having excellent dielectric property.

A dielectric thin film comprising a main component comprised of an oxynitride expressed by a compositional formula of $A_aB_bO_oN_n$ (a+b+o+n=5), wherein said "A" is one or more selected from the group consisting of Sr, Ba, Ca, La, Ce, Pr, Nd, and Na, said "B" is one or more selected from the group consisting of Ta, Nb, Ti, and W, and crystalline particles constituting said dielectric thin film are polycrystalline which are not aligned to a particular crystal plane orientation, and a size of a crystallite of the crystalline particles included in the dielectric thin film is 100 nm or less.

3 Claims, 3 Drawing Sheets

1
14
15
13
15
12
11

(58) Field of Classification Search

CPC .......... C04B 35/63416; C04B 35/6262; C04B 35/6264; C04B 35/62218; C04B 2235/768; C04B 2235/3886; C04B 2235/602; C04B 2235/612; C04B 2235/656; H01G 4/33; H01G 4/85; H01G 4/1218; H01G 4/1272; H01B 3/10

See application file for complete search history.

(56) References Cited

U.S. PATENT DOCUMENTS

| | | | | |
|---|---|---|---|---|
| 2002/0151434 | A1* | 10/2002 | Domen | B01J 23/02 502/200 |
| 2005/0227859 | A1* | 10/2005 | Nakabayashi | B01J 21/063 502/150 |
| 2008/0286643 | A1* | 11/2008 | Iwasaki | B01D 53/326 429/111 |
| 2011/0090006 | A1* | 4/2011 | Yamazaki | H04M 1/0266 327/581 |

OTHER PUBLICATIONS

Yasushi Hirose, et al; "Epitaxial Growth of Perovskite Oxynitride CaTaO2N Thin Film"; Kanagawa Academy of Science and Technology; Aug. 26, 2014; pp. 32-33.

I. Marozau, et al., "Pulsed laser deposition and characterisation of perovskite-type LaTiO3-xNx thin films", Acta Materialia, vol. 59, pp. 7145-7154, 2011.

* cited by examiner

OXYNITRIDE THIN FILM AND CAPACITANCE ELEMENT

BACKGROUND OF THE INVENTION

1. Field of the Invention

The present invention relates to a dielectric thin film having a main component comprised of an oxynitride, and a capacitance including the dielectric thin film.

2. Description of the Related Art

As digital devices have been down sized and have attained higher performances in recent years, the capacitance element using a high performance dielectric thin film is demanded.

Conventionally, a thin film using metal oxide material has been widely used as the dielectric thin film. However, the improvement of the property of the dielectric thin film made by the metal oxide material is reaching its limits, and new material having higher property is demanded. As one of the proposed new materials, a metal oxynitride material may be mentioned of which part of oxygen atoms in oxygen-octahedron structure of perovskite type crystal structure are substituted with nitrogen atoms. However, the dielectric thin film having the metal oxynitride material is difficult to obtain.

For example, a patent document 1 and a patent document 2 disclose a method of producing a powder of perovskite type oxynitride $ABO_2N$. However, the patent document 1 and the patent document 2 do not disclose of obtaining a thin film using the perovskite type oxynitride $ABO_2N$.

Also, the non-patent document 1 and the non-patent document 2 disclose that the thin film made of the perovskite type oxynitride $ABO_2N$ was produced. However, the thin film obtained in a non-patent document 1 and a non-patent document 2 is an epitaxial film.

The epitaxial film has a disadvantage that it takes extremely long time to produce. The non-patent document 1 discloses that the production of the epitaxial film having a thickness of 20 nm or less took 530 hours or less, which is a long time.

[Patent document 1] JP Patent Application Laid Open No. S61-122108

[Patent document 2] JP Patent Application Laid Open No. 2013-001625

[Non-patent document 1] Scientific Reports 4, DOI: 10.1038/srep04987

[Non-patent document 2] KAST Year 2013 Research outline p. 32-33

SUMMARY OF THE INVENTION

The present invention is attained in view of such circumstances, and the object is to provide the dielectric thin film having a main component made of oxynitride having high production efficiency and excellent dielectric property, and to provide the capacitance element including the dielectric thin film.

The dielectric thin film according to the present invention is a dielectric thin film comprising a main component comprised of an oxynitride expressed by a compositional formula of $A_aB_bO_oN_n$ (a+b+o+n=5), wherein "A" is one or more selected from the group consisting of Sr, Ba, Ca, La, Ce, Pr, Nd, and Na, "B" is one or more selected from the group consisting of Ta, Nb, Ti, and W, and crystalline particles constituting said dielectric thin film are polycrystalline which are not aligned to a particular crystal plane orientation, and a size of a crystallite of the crystalline particles included in the dielectric thin film is 100 nm or less.

The dielectric thin film according to the present invention has the above mentioned characteristics, and thereby the dielectric property can be enhanced.

Preferably, the size of the crystallite calculated based on a result of X-ray diffraction measurement using Out-of-Plane method to the dielectric thin film is 1.5 times or more of the size of the crystallite calculated based on X-ray diffraction measurement using In-Plane method.

Preferably, "A" is Sr, "B" is Ta and/or Nb, and "n" is larger than 0 and smaller than 1.

The capacitance element according to the present invention comprises the dielectric thin film.

BRIEF DESCRIPTION OF THE DRAWINGS

FIG. 3(*b*) is a schematic diagram showing X-ray diffraction measurement by In-Plane method.

DESCRIPTION OF THE PREFERRED EMBODIMENTS

Hereinafter, the present invention will be explained by referring to embodiments.

Figure 1:
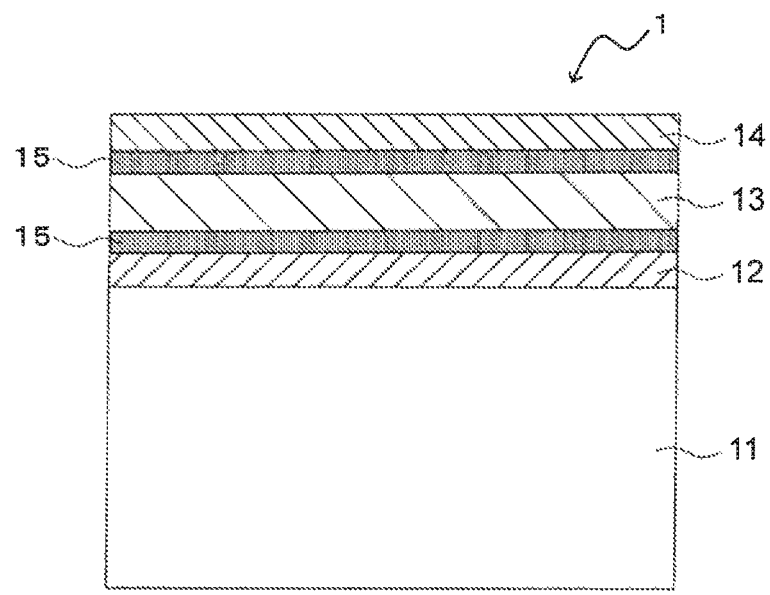
FIG. 1 is a schematic diagram of a thin film capacitor according to one embodiment of the present invention.

FIG. 1 shows the schematic diagram of the thin film capacitor (the capacitance element) according to the present embodiment. In the thin film capacitor 1 shown in FIG. 1, a lower electrode 12 and a dielectric thin film 13 are formed in this order on a substrate 11, and an upper electrode 14 is on the dielectric thin film 13.

The material of the substrate 11 is not particularly limited, but Si single crystal substrate is used as the substrate 11 because of the cost and because it is easy to obtain. In case flexibility is important, Ni foil can be used as the substrate.

The material of the lower electrode 12 and the upper electrode 14 are not particularly limited as long as these function as the electrode. For example, Pt, Ag, and Ni or so may be mentioned. The thickness of the lower electrode 12 is preferably 0.01 to 10 μm. The thickness of the upper electrode 14 is preferably 0.01 to 10 μm.

The dielectric thin film 13 has the main component made of oxynitride expressed by the compositional formula of $A_aB_bO_oN_n$ (a+b+o+n=5).

"A" is one or more elements selected from the group consisting of Sr, Ba, Ca, La, Ce, Pr, Nd and Na. Preferably, "A" is one or more elements selected from the group consisting of Sr, Ba, La, and Nd. More preferably, "A" is Sr, By using the above mentioned elements as "A"; a high capacitance can be obtained. "B" is one or more elements selected from the group consisting of Ta, Nb, Ti, and W.

Preferably, "B" is one or more elements selected from the group consisting of Ta and Nb. More preferably, "B" is Ta. By using the above mentioned elements as "B", the dielectric thin film 13 with little secondary phase can be obtained.

Also, in the compositional formula $A_aB_bO_oN_n$, preferably a<1 is satisfied. Also, preferably, a/b>1 is satisfied, and more preferably a/b≥1.05 is satisfied. Also, preferably 1>n>0 is satisfied, more preferably 1>n≥0.3, and more preferably 1>n≥0.5 is satisfied. By having "a", "b", and "n" within the above mentioned range, a good dielectric property can be obtained.

The crystalline particles X constituting the dielectric thin film 13 are polycrystalline which is not aligned to a specific crystal plane orientation.

Figure 2:
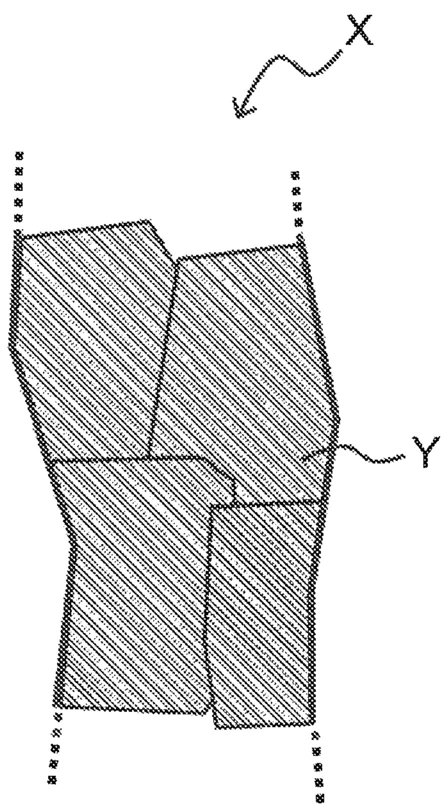
FIG. 2 is a schematic diagram showing the shape of crystallite included in the crystalline particles in the dielectric thin film according to one embodiment of the present invention.

The crystalline particles X include plurality of longitudinal crystallite Y as shown in FIG. 2. The crystallite Y is a minimum unit of the crystalline constituted by same crystal plane in the crystalline particle X. Thus, a connection part between the crystallites Y has discontinuous crystal lattice, but this does not mean that a secondary phase or grain boundary exist at the connection part; and in fact it is continuous in terms of a composition and a crystallinity, further an aggregation of series of crystallites is the crystalline particles X. The crystal planes of plurality of the crystallites Y are aligned towards the same direction in one crystalline particle. A boundary which corresponds to a grain boundary exists at the connection part between the crystalline particles X and this can be observed by Transmission Electron Microscope (TEM).

Figure 4:
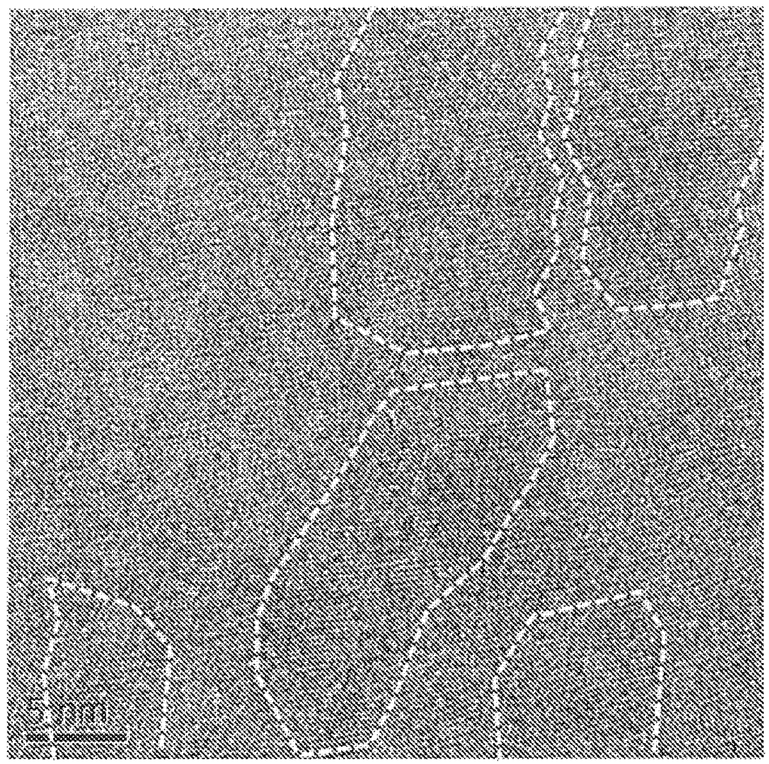
FIG. 4 is TEM image of a dielectric thin film sample of the example 1. The broken line shows the shape of the crystallite.

In the present embodiment, the size of the crystallite Y included in the crystalline particles X is 100 nm or less. Since the size of the crystallite Y is 100 nm or less, the dielectric property can be improved. The size of the crystallite Y is measured based on TEM image as shown in FIG. 4.

In general, it is known that by decreasing the size of the crystallite included in the crystalline particles constituting the dielectric thin film, a decrease rate of the dielectric constant with respect to the frequency can be suppressed to a small level. On the other hand, when the size of the crystallite is decreased, it is known that the obtained dielectric constant is also decreased. Particularly, it is known that for barium titanate used as high capacity dielectrics, by decreasing the size of the crystallite, a high tetragonality (c/a ratio) at close-packed hexagonal lattice becomes difficult to obtain; and when the size of crystallite is 100 nm or less, it is known that the dielectric constant decreases drastically. If high dielectric constant can be obtained even when the size of the crystallite is 100 nm or less, then ideal dielectrics having small decrease of the permittivity with respect to the frequency can be attained, however such dielectrics have not been reported yet. In the present embodiment, the crystalline particles constituting the dielectric thin film are polycrystalline which are not aligned to a specific crystal plane orientation, and when the size of the crystallite included in the crystalline particles is 100 nm or less, the decrease rate of the dielectric constant with respect to the frequency can be suppressed to a small level, and at the same time the dielectric constant can be improved.

Also, the size of the crystallite calculated based on the result of X-ray diffraction measurement by Out-of-Plane method to the dielectric thin film 13 is preferably 1.5 times or more, more preferably 1.8 times or more, and further preferably 2.5 times or more of the size of the crystallite calculated based on the result of X-ray diffraction measurement by In-Plane method. The dielectric property can be improved by having the ratio between the size of the crystallite by Out-of-Plane method and the size of the crystallite by In-Plane method within the above mentioned range.

Figure 3A:
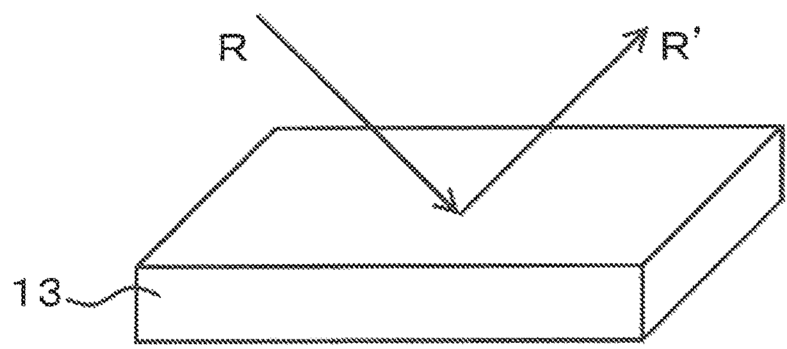
FIG. 3(*a*) is a schematic diagram showing X-ray diffraction measurement by Out-of-Plane method.
Figure 3B:
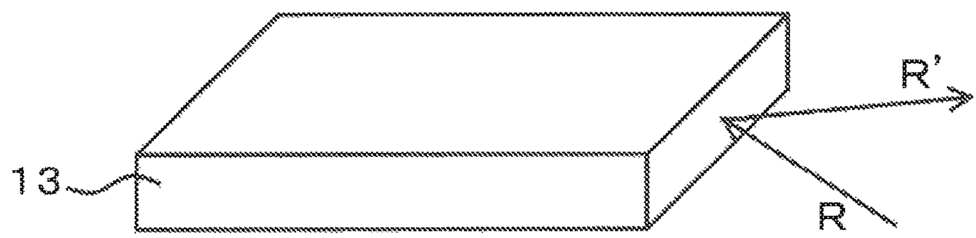

Note that, for Out-of-Plane method, incident X-ray R is irradiated within the angle range of 5 to 90° from the surface of the dielectric thin film as shown in FIG. 3(*a*), and the size of the crystallite is evaluated from the diffraction X-ray R' thereof. Thereby, the size of the crystallite in the thickness direction (the vertical direction) of the dielectric thin film can be measured.

Also, as shown in FIG. 3(*b*), for In-Plane method, the incident X-ray R is irradiated from the side face of the dielectric thin film by fixing an incident angle to a small angle near a total reflection critical angle (0.2 to 0.5°), then the size of the crystallite is evaluated from the diffraction X-ray R'. Thereby, the size in the bilateral direction of the crystallite can be measured.

The thickness of the dielectric thin film 13 is not particularly limited, but preferably it is 10 nm to 2 μm, and more preferably 10 nm to 1 μm.

The dielectric constant ε of the dielectric thin film 13 is not particularly limited, but preferably it is 1800 or more, more preferably 2500 or more, and further preferably 2700 or more. By having the dielectric constant ε within the above mentioned range, the dielectric thin film having excellent dielectric property can be obtained.

Note that, the dielectric constant ε can be measured under the condition of the voltage of 1 Vrms/μm, and the frequency of 20 Hz to 10 kHz.

The dielectric constant decrease rate Δε of the dielectric thin film 13 is preferably less than ±20%, and more preferably within ±10%. By having the dielectric constant decrease rate Δε within the above mentioned range, the dielectric thin film having excellent dielectric property can be obtained.

Note that, the dielectric constant decrease rate Δε can be calculated by dividing the difference between the dielectric constant measured at the frequency of 20 Hz and 10 kHz with the dielectric constant measured at the frequency of 20 Hz.

Production Method of the Thin Film Capacitor 1

Next, the production method of the thin film capacitor 1 will be explained. Hereinafter, the dielectric thin film 13 having the main composition including the oxynitride expressed by the compositional formula of $A_aB_bO_oN_n$ wherein "A" atom is Sr, "B" atom is Ta will be used as an example to explain, but same applies even if other atoms are used.

The film forming method for forming the thin film as the dielectric thin film 13 at the end is not particularly limited. For example, a vacuum deposition method, a spattering method, PLD method (Pulse Laser Deposition method), MO-CVD method (Metal Organic Chemical Vapor Deposition method), MOD method (Metal Organic Decomposition method), a sol-gel method, and CSD method (Chemical Solution Deposition method) or so may be mentioned. Also, trace amounts of impurities and sub components may be included in the material when forming the film; however it is not a problem as long as it is an amount which does not significantly compromise the property of the thin film. Also, the dielectric thin film 13 according to the present embodiment may include trace amounts of impurities and sub components as long as these do not significantly compromise the property.

Among the method of forming the film, when the film is formed by PLD method, the spattering method, and CSD method or so, the thin film obtained at the end is likely to be a polycrystalline film. It may be made by CVD method, but because many elements are included, PLD method and the spattering method or so have higher composition control property. In the present embodiment, the film forming method using PLD method will be described.

First, Si single crystal substrate as the substrate 11 is prepared. Next, $SiO_2$, $TiO_x$, and Pt are formed in this order on Si single crystal substrate, and the lower electrode 12 made of Pt is formed. The method of forming the lower electrode 12 is not particularly limited. For example, the spattering method and CND method or so may be mentioned.

Next, the metal oxide thin film is formed on the lower electrode 12 by PLD method. Also, in order to expose part of the lower electrode 12, an area without the thin film is formed using a metal mask.

In PLD method, first a target including the constituting elements of the dielectric thin film as the object is placed in the film forming chamber. Next, a pulse laser is irradiated on the surface of the target. Due to the strong energy of pulse laser, the surface of the target is instantly evaporated. Then, the evaporated substance is deposited on the substrate which is placed by facing towards the target, thereby the metal oxide thin film is formed.

As the target, for example, a precursor having the compositional formula $A_2B_2O_7$ can be used. This precursor is preferably a perovskite layer form compound wherein a perovskite unit called perovskite slab and an oxygen excess layer are stacked in an alternating manner.

The type of target is not particularly limited, and a pellet formed by compressing the oxynitride powder can be used. Note that, N content included must be strictly regulated, thus the pellet of $A_2B_2O_7$ is used so that better controlling property can be attained. Also, for the target, preferably each element is distributed evenly, but the distribution may be uneven as long as the quality of the obtained dielectric thin film is not affected. Further, the target does not necessarily have to be one, and plurality of targets including part of the constituting elements of the dielectric thin film can be prepared and used for forming the film. The shape of the target is not particularly limited as well, and the shape may be which is appropriate for the film forming device being used. By regulating the film forming condition (a partial pressure of oxygen, a partial pressure of nitrogen, the size of the film forming chamber, and the position of the gas introducing tube or so), "a" and "b" of the dielectric thin film obtained at the end can be regulated. For example, by making a/b of the target large, a/b in the formed film can be enlarged as well.

For example, in case the composition of the dielectric thin film obtained at the end is $Sr_aTa_bO_oN_n$, then a sintered body including $Sr_2Ta_2O_7$ is prepared as the target. Further, by regulating the film forming condition (for example, a partial pressure of oxygen, a partial pressure of nitrogen, the size of the film forming chamber, and the position of the gas introducing tube or so), "a" and "b" of the dielectric thin film obtained at the end can be regulated.

The film forming condition is also important. The metal element evaporated from the target due to the pulse laser is influenced by the elements constituting the atmosphere in the film forming chamber, and will reach to the film forming face of the substrate. The characteristic of PLD method is that it allows broad range of the atmospheric pressure from an extra high vacuum to near atmospheric pressure. However, the film with high crystallinity tends to be easily obtained when the vacuum condition is higher. On the other hand, the film with small defect of oxygen or so tends to be easily obtained when the atmospheric pressure of oxygen or so is higher. When plasma is used together, the range of pressure that the plasma can maintain is limited, thus appropriate pressure may be determined based on the crystallinity and defects or so within the range thereof. Particularly, when forming the film by PLD method, a total pressure is preferably $1\times10^{-2}$ Pa or more, and more preferably the total pressure is $2\times10^{-2}$ Pa or more. The preferable condition is the condition of which a degree of vacuum is relatively not high. This is a condition suitable for forming the film having small crystallite, and in this case the crystallinity is evaluated low. Note that, for the spattering method, argon is preferably used together as the atmosphere while forming the film. The film forming rate is preferably 30 nm/min or less, and more preferably 10 nm/min or less.

Also, for PLD method, when forming the film, the substrate 11 is preferably heated by an infrared laser in order to crystalize the metal oxide thin film. A heating temperature of the substrate 11 differs depending on the constituting element and the composition or so of the metal oxide thin film and the substrate 11, but for example preferably it is 550 to 850° C., and more preferably 600 to 800° C. By making the temperature of the substrate within the above mentioned range while forming the film, the dielectric property improves because pore is scarcely formed. Also, since the temperature of the substrate 11 has an appropriate temperature, the metal oxynitride thin film tends to easily crystalize, and the cracks generated while cooling can be prevented.

When forming the film, by carrying out a nitriding treatment by introducing nitrogen radical, the dielectric thin film 13 made of perovskite type oxynitride can be obtained. The nitriding treatment may be done by introducing nitrogen radical after the metal oxide film is formed, but the nitrogen content in the thin film can be increased by introducing nitrogen radical while forming the film.

The dielectric thin film 13 on the substrate needs to be carried out with Rapid Thermal Anneal (RTA) treatment after the film is formed. In order to improve the frequency characteristic, the atmosphere during the annealing must have higher oxygen partial pressure and nitrogen partial pressure than the film forming atmosphere.

Lastly, by forming the upper electrode 14 on the dielectric thin film 13, the thin film capacitor 1 can be produced. Note that, the material of the upper electrode 14 is not particularly limited, and Ag, Au, and Cu or so can be used. Also, the method of forming the upper electrode 14 is not particularly limited as well. For example, it can be formed by evaporation and the spattering method or so.

Note that, an intermediate layer 15 may be present between the dielectric thin film 13 and the lower electrode 12, and between the dielectric thin film 13 and the upper electrode 14. The intermediate layer 15 may be constituted by an insulation material, and it may be constituted by a conductive material. As the insulation material, compounds such as oxides or nitrides including at least one selected from the group consisting of aluminum, silicon, strontium, and tantalum or so can be used. As the conductive material, Cu, Al, Ni, Au, and Ni—Cr or so can be used. As the method of forming the intermediate layer 15, the same method as the method of forming the above mentioned dielectric thin film 13 or the method of forming the lower electrode 12 and the upper electrode 14 can be used. Further, the intermediate layer 15 can function as the layer such as an insulation layer, a stress relieving layer, or a layer to smooth out a roughness of the electrode face or so.

The intermediate layer 15 may be present at both between the dielectric thin film 13 and the lower electrode 12, and between the dielectric thin film 13 and the upper electrode 14, or it may be present at either one. If a plurality of intermediate layers is present, each intermediate layer may have different function.

The thickness of the intermediate layer 15 is preferably 20% or less of the thickness of the dielectric thin layer 13, and more preferably 10% or less.

The dielectric thin film according to the present embodiment can be used for example as a voltage tunable capacitor, and a dielectric layer of a high density capacitor device such as a decoupling thin film capacitor or so.

The capacitance element according to the present embodiment is an element using an excellent dielectric property of the dielectric thin film according to the present embodiment, and a capacitor, a thermistor, a filter, a diplexer, a resonator, an emitter, an antenna, a piezoelectric element, a transistor, a ferroelectric memory or so are included. The dielectric thin film according to the present embodiment is suitably used to the capacitance element which requires particularly high dielectric characteristic.

As the method of producing the capacitor as an example of the capacitance element according to the present embodiment, the method of forming a highly tunable device structure having an appropriate electrode on the substrate may be mentioned. The highly tunable device structure is not particularly limited, but for example that integrated with other thin film device such as SAW duplexer, a switch by RF-MEMS, MEMS air gap varactor of piezoelectric driving type, a fixed (low tunable) high density thin film capacitor, TFBAR circuit, a resistor, an inductor, and TFT having oxides as a base or so may be mentioned.

Hereinabove, the embodiments of the present invention were explained, but the present invention is not to be limited to these embodiments in any way, and the present invention can be carried out in various different embodiments within the scope of the present invention.

EXAMPLE

Hereinafter, the present invention will be described based on further detailed examples, but the present invention is not to be limited thereto.

Example 1

First, as the material of a sintered body of $Sr_2Ta_2O_7$ used as the target for forming the film, $SrCO_3$ powder and $Ta_2O_5$ powder were prepared. $SrCO_3$ powder and $Ta_2O_5$ powder were weighed so that a mol ratio of Sr/Ta was 1.

Next, $SrCO_3$ powder and $Ta_2O_5$ powder were mixed for 16 hours by a wet ball mill using ethanol solvent, thereby a mixed slurry was obtained.

Next, said mixed slurry was dried at 80° C. for 12 hours using a thermostat drier, and the mixture was obtained.

Next, said mixture was lightly ground in a mortar, and then placed in a ceramic crucible. Then, using an electric furnace, the heat treatment was carried out under air atmosphere at 1000° C. for 2 hours; thereby the calcined material was obtained.

Next, said calcined material was again mixed for 16 hours by a wet ball mill using ethanol solvent, and then a post-calcination slurry was obtained.

The obtained post-calcination slurry was dried at 80° C. for 12 hours using the thermostat drier, and a post-calcination mixture was obtained.

The post-calcination mixture was added and mixed with polyvinyl alcohol as the binder, thereby a granule was obtained. The added amount of polyvinyl alcohol solution was 0.6 wt % with respect to 100 wt % of the ground material.

The granule was molded into a cylindrical columnar shape having a diameter of about 23 mm, and a height of about 9 mm; thereby the molded article was obtained. The molding method was CIP molding.

The molded article was fired under air atmosphere at 1400° C. for 2 hours using the electric furnace; thereby a sintered article was obtained. Further, a top face and a bottom face of the sintered article was mirror polished, and the target for forming the film having a height of 5 mm was obtained. Note that, a relative density of the target for forming the film was 96 to 98%.

The obtained target for forming the film as mentioned in above was placed to the film forming device, then Si substrate was placed by facing towards the target for forming the film. As Si substrate, those having Pt film as the lower electrode on the surface was used.

In the example 1, the film was formed by PLD method so that the thickness was 1000 nm. Here, nitrogen radical was introduced into the film forming chamber, and the dielectric oxide film was formed. The nitrogen partial pressure during the film forming was $1\times10^{-3}$ Pa. The film forming temperature was 700° C. After forming the film, the introduction of nitrogen radical was stopped, and at the same time nitrogen and oxygen were introduced, then the annealing was carried out for 30 minutes at 700° C. Then, it was cooled to 200° C., and the atmosphere was vacuumed, thereby the dielectric thin film sample was obtained. The obtained dielectric thin film sample was evaluated as discussed in below.

Evaluation of the Polycrystalline Film and the Alignment Thereof

The obtained sample was subjected to XRD measurement, thereby confirmed whether it was an alignment film aligned to specific plane and also confirmed whether it had polycrystallinity from XRD pattern. If polycrystallinity was confirmed and was not the alignment film aligned to specific plane, then it was evaluated as "good"; and if polycrystallinitiy was not confirmed and was the alignment film, then it was evaluated "poor". Also, the composition of oxynitride included in the obtained thin film sample was quantified by photoelectron spectroscopy using PHI Quantera II™ made by ULVAC-PHI, Inc. While carrying out Ar etching, the composition in the depth direction of the thin film was quantified.

Size Measuring of Crystallite Based on TEM

For the obtained sample, TEM image was obtained using Transmission Electron Microscope (TEM). The obtained TEM image is shown in FIG. 4. Based on TEM image shown in FIG. 4, the size of crystallite was measured. Also, the presence of the particle having the columnar shape was verified using TEM. The results are shown in Table 1.

Size Measurement of Crystallite by XRD

For the obtained sample, the size of crystallite was measured by Out-of-Plane method and In-Plane method.

Measurement the Dielectric Constant ε

The dielectric constant (ε) was evaluated under the voltage of 1 Vrms/μm and the frequency of 20 Hz to 10 kHz, and then the decrease rate was calculated. The upper electrode for evaluating the dielectric constant was formed by depositing Ag on the electrode having the size of 100 μm of diameter. The results are shown in Table 1.

Measurement of the Dielectric Constant Decrease Rate Δε

For the sample formed with the Ag electrode, the dielectric constant decrease rate Δε was measured. The dielectric constant decrease Δε was calculated by dividing the difference between the dielectric constant measured at the frequency of 20 Hz and 10 kHz with the dielectric constant measured at the frequency of 20 Hz.

Examples 2 to 4

The atmosphere during film forming was adjusted so that the size of the crystallite by XRD was regulated as shown in Table 1, other than that the dielectric thin film sample was obtained as same as the example 1. The evaluation was carried out as same as the example 1.

Example 5

The dielectric thin film sample was obtained as same as the example 3 except for the following. That is, in the example 5, as the material of the sintered body of $(La_{0.1}Sr_{0.9})_2(Ta_{0.9}Ti_{0.1})_2O_7$ used as the target for forming the film, $La_2O_3$ powder, $SrCO_3$ powder, $Ta_2O_5$ powder, and $TiO_2$ powder were prepared. $La_2O_3$ powder, $SrCO_3$ powder, $Ta_2O_5$ powder, and $TiO_2$ powder were weighed so that the mol ratio of $(La_{0.1}Sr_{0.9})/(Ta_{0.9}Ti_{0.1})$ was 1.

Example 6

The dielectric thin film sample was obtained as same as the example 3 except for the following. That is, in the example 6, as the material of the sintered body of $(Ba_{0.2}Sr_{0.8})_2Ta_2O_7$ used as the target for forming the film, $BaCO_3$ powder, $SrCO_3$ powder, and $Ta_2O_5$ powder were prepared, $BaCO_3$ powder, $SrCO_3$ powder, and $Ta_2O_5$ powder were weighed so that the mol ratio of $(Ba_{0.2}Sr_{0.8})/(Ta)$ was 1. $Sr_2Ta_2O_7$ composition exists as the sintered body having the perovskite slab structure; on the contrary $Ba_2Ta_2O_7$ does not exist. However, by weighing and blending $BaCO_3$ powder, $SrCO_3$ powder, and $Ta_2O_5$ powder so to satisfy the mol ratio of $(Ba_{0.2}Sr_{0.8})/(Ta)$ of 1, the sintered body of $(Ba_{0.2}Sr_{0.8})_2Ta_2O_7$ composition can be obtained. The obtained sintered body has the same X-ray diffraction pattern as $Sr_2Ta_2O_7$, and the peak positon thereof shifted to the lower angle side.

Comparative Example 1

The comparative example 1 was calculated from the non-patent document 1. The non-patent document 1 forms $SrTaO_2N$ thin film crystal sample by carrying out the epitaxial growth using a nitrogen plasma assisted pulse laser deposition method. Specifically, using niobium added strontium titanate ($Nb:SrTiO_3$) single crystal having smaller lattice constant than $SrTaO_2N$ as the substrate for the crystal growth, and strontium tantalate vaporized by irradiating the ultraviolet laser and nitrogen activated by plasma were reacted. The same evaluation as the example 1 was carried out. The results are shown in Table 1.

Examples 7 to 12

In the examples 7 to 12, the dielectric thin film sample was obtained as same as the example 1, except that the film was formed by changing the nitrogen partial pressure the atmosphere during the film forming. The same evaluation as the example 1 was carried out. The results are shown in Table 1.

TABLE 1

| | | | | XRD | | | | Dielectric property | |
|---|---|---|---|---|---|---|---|---|---|
| | Composition | Particles of column form | Size of crystallite | Poly-crystallinity | Out-of-Plane | In-Plane | Ratio | Dielectric constant ϵ | Dielectric constant decrease rate Δ ε |
| Example 1 | $SrTaO_2N$ | Present | <100 nm | Good | 20.2 | 7.1 | 2.85 | 3000 | −4% |
| Example 2 | $SrTaO_2N$ | Present | <100 nm | Good | 16.8 | 10.9 | 1.5 | 2211 | −9% |
| Example 3 | $SrTaO_2N$ | Present | <100 nm | Good | 16.2 | 9.0 | 1.8 | 2533 | −6% |
| Example 4 | $SrTaO_2N$ | Present | <100 nm | Good | 17.3 | 10.2 | 1.7 | 1886 | −9% |
| Example 5 | $(La_{0.1}Sr_{0.9})(Ta_{0.9}Ti_{0.1})O_2N$ | Present | <100 nm | Good | 18.1 | 11.8 | 1.5 | 2710 | −9% |
| Example 6 | $(Ba_{0.2}Sr_{0.8})TaO_2N$ | Present | <100 nm | Good | 15.4 | 8.7 | 1.9 | 1990 | −7% |
| Example 7 | $SrTaO_2N$ | Present | <100 nm | Good | 9.4 | 19.8 | 0.5 | 851 | −48% |
| Example 8 | $SrTaO_2N$ | Present | <100 nm | Good | 9.9 | 17.4 | 0.6 | 739 | −50% |
| Example 9 | $SrTaO_2N$ | Present | <100 nm | Good | 13.4 | 15.6 | 0.9 | 3020 | −21% |
| Example 10 | $SrTaO_2N$ | Present | <100 nm | Good | 10.8 | 23.6 | 0.5 | 1415 | −48% |
| Example 11 | $SrTaO_2N$ | Present | <100 nm | Good | 9.9 | 20.7 | 0.5 | 1671 | −45% |
| Example 12 | $SrTaO_2N$ | Present | <100 nm | Good | 10.3 | 20.3 | 0.5 | 1364 | −48% |
| Comparative example 1 | $SrTaO_2N$ | None | 288 nm | Good | — | — | — | 2300 | −20% |

According to Table 1, for the examples 1 to 12, the dielectric thin film sample formed of the crystalline particles which are polycrystalline not aligned to a specific crystal plane orientation was obtained, and exhibited excellent dielectric property. On the other hand, the dielectric thin film sample of the comparative example 1 had the size of the crystallite included in the crystalline particles larger than 100 nm, and the decrease rate of the dielectric constant with respect to the frequency was deteriorated.

NUMERICAL REFERENCES

1 . . . Thin film capacitor
11 . . . Substrate
12 . . . Lower electrode
14 . . . Upper electrode
15 . . . Intermediate layer
X . . . Crystalline particle
Y . . . Crystallite
R . . . Incident X-ray
R' . . . Diffraction X-ray

The invention claimed is:

1. A capacitance element comprising a dielectric thin film comprising a main component comprised of an oxynitride expressed by a compositional formula of $A_aB_bO_oN_n$ (a+b+o+n=5), wherein "A" is one or more selected from the group consisting of Sr, Ba, Ca, La, Ce, Pr, Nd, and Na, "B" is one or more selected from the group consisting of Ta, Nb, Ti, and W, and crystalline particles constituting said dielectric thin film are polycrystalline which are not aligned to a particular crystal plane orientation, and a size of a crystallite of the crystalline particles included in the dielectric thin film is 100 nm or less.

2. The capacitance element according to claim 1, wherein the size of the crystallite calculated based on a result of X-ray diffraction measurement using Out-of-Plane method to the dielectric thin film is 1.5 times or more of the size of the crystallite calculated based on X-ray diffraction measurement using In-Plane method.

3. The capacitance element according to claim 1, wherein "A" is Sr, "B" is Ta and/or Nb, and "n" is larger than 0 and smaller than 1.

* * * * *